US012161039B2

(12) United States Patent
Shih

(10) Patent No.: US 12,161,039 B2
(45) Date of Patent: Dec. 3, 2024

(54) IN-CELL OPTICAL FINGERPRINT DISPLAY DEVICE

(71) Applicant: FocalTech Systems Co., Ltd., Hsinchu (TW)

(72) Inventor: Po-Sheng Shih, Hsinchu (TW)

(73) Assignee: FOCALTECH SYSTEMS CO., LTD., Hsinchu (TW)

( * ) Notice: Subject to any disclaimer, the term of this patent is extended or adjusted under 35 U.S.C. 154(b) by 0 days.

(21) Appl. No.: 18/588,360

(22) Filed: Feb. 27, 2024

(65) Prior Publication Data

US 2024/0244920 A1    Jul. 18, 2024

Related U.S. Application Data

(62) Division of application No. 17/376,368, filed on Jul. 15, 2021, now Pat. No. 11,963,427.

(60) Provisional application No. 63/057,486, filed on Jul. 28, 2020.

(30) Foreign Application Priority Data

Dec. 23, 2020   (TW) .................................. 109145691

(51) Int. Cl.
| | |
|---|---|
| *H10K 59/65* | (2023.01) |
| *G02F 1/1333* | (2006.01) |
| *G02F 1/1335* | (2006.01) |
| *G02F 1/1343* | (2006.01) |
| *G06V 40/12* | (2022.01) |
| *G06V 40/13* | (2022.01) |
| *H10K 59/35* | (2023.01) |

(52) U.S. Cl.
CPC ......... *H10K 59/65* (2023.02); *G02F 1/13338* (2013.01); *G02F 1/133514* (2013.01); *G06V 40/13* (2022.01); *G06V 40/1318* (2022.01); *G06V 40/1359* (2022.01); *G06V 40/1394* (2022.01); *H10K 59/35* (2023.02); *G02F 1/134309* (2013.01)

(58) Field of Classification Search
CPC ..................... G06V 40/1218; G02F 1/13338
See application file for complete search history.

(56) References Cited

U.S. PATENT DOCUMENTS

| | | | | |
|---|---|---|---|---|
| 2009/0268132 A1* | 10/2009 | Takama | ................ | G06F 3/0421 349/116 |
| 2015/0301402 A1* | 10/2015 | Kimura | ................ | G06F 3/0412 359/891 |
| 2021/0033918 A1* | 2/2021 | Zhang | ............... | G02F 1/133514 |

FOREIGN PATENT DOCUMENTS

| | | |
|---|---|---|
| CN | 110970480 A | 4/2020 |
| CN | 110991351 A | 4/2020 |

\* cited by examiner

*Primary Examiner* — Jessica M Merlin
(74) *Attorney, Agent, or Firm* — MUNCY, GEISSLER, OLDS & LOWE, P.C.

(57) ABSTRACT

An in-cell optical fingerprint display device has a substrate, a plurality of pixel units disposed on the substrate and arranged in a matrix, and a transparent cover disposed on the plurality of pixel units. At least one pixel unit includes: a display pixel unit at least has a red sub-pixel unit, a green sub-pixel unit, and a blue sub-pixel unit disposed on the substrate; and a fingerprint pixel unit having an optical fingerprint sensor disposed on the substrate, and a specific-color color resin arranged above the optical fingerprint sensor, wherein the specific-color color resin is a blue color resin or a green color resin.

14 Claims, 8 Drawing Sheets

IN-CELL OPTICAL FINGERPRINT DISPLAY DEVICE

CROSS REFERENCE TO RELATED APPLICATION

This application is a divisional of U.S. patent application Ser. No. 17/376,368, entitled "In-cell optical fingerprint display device" filed Jul. 15, 2021, which claims the benefit of filing date of U.S. Provisional Application Ser. No. 63/057,486, entitled "Optical fingerprint pixel and circuit structure" filed Jul. 28, 2020 under 35 USC § 119(e)(1), and claims the benefits of the Taiwan Patent Application Serial Number 109145691, filed on Dec. 23, 2020, the subject matters of which are incorporated herein by reference.

BACKGROUND

1. Field of the Disclosure

The present disclosure relates to a fingerprint display device and, more particularly, to an in-cell optical fingerprint display device.

2. Description of Related Art

FIG. 1 is a schematic diagram illustrating the integration of optical fingerprint sensors and a liquid crystal display (LCD) panel. The optical fingerprint sensor 11 is disposed, for example, between the thin film transistor layer 12 and the filter substrate layer 13 of the liquid crystal display panel structure, so that the light from the reflective layer 14 can be reflected, when projecting on the finger pressed against the glass substrate 15, to the fingerprint sensor 11. Since the reflectivity of the ridge and valley of the fingerprint is different, the fingerprint image can be reconstructed according to the sensing amount of the fingerprint sensor 11.

With the structure of the aforementioned optical fingerprint display device, when used in an outdoor environment, strong sunlight 25 may penetrate the finger and enter the optical fingerprint sensor 11, and the light penetrating the finger will cause an increase in the background signal. Therefore, the difference between the ridge and valley signals of the fingerprint is not obvious, which affects the judgment of the real fingerprint, and causes an increase in the false rejection rate (FRR) of fingerprint recognition. In addition, the aforementioned optical fingerprint display device suffers another problem in that the ability to resolve the fake fingerprint is poor. If the pattern of the fake fingerprint is the same as the real fingerprint, the shapes of the fake and real fingerprints detected by the optical fingerprint sensor 11 will be similar, and thus it is unable to identify the fake fingerprint.

Therefore, it is desirable to provide an improved fingerprint display device to mitigate and/or obviate the aforementioned problems.

SUMMARY

The object of the present disclosure is to provide an in-cell optical fingerprint display device, which is capable of reducing the false rejection rate (FRR) by adding a specific-color color resin above the optical fingerprint sensor, and achieving the anti-counterfeiting function by introducing a specific color resin arrangement.

In one aspect of the present disclosure, there is provided an in-cell optical fingerprint display device having a substrate, a plurality of pixel units disposed on the substrate and arranged in a matrix, and a transparent cover disposed on the plurality of pixel units, wherein each of the pixel units comprises: a display pixel unit at least including a red sub-pixel unit, a green sub-pixel unit and a blue sub-pixel unit disposed on the substrate, and a fingerprint pixel unit having an optical fingerprint sensor disposed on the substrate, in which there is only one color resin of blue color or red color or no color resin disposed above the optical fingerprint sensor of at least one of the pixel units and there is no green color resin disposed above the optical fingerprint sensor of the at least one of the pixel units, while only one color resin of green color is disposed above the optical fingerprint sensor of each of remaining pixel units and there is no red color resin or blue color resin disposed above the optical fingerprint sensor of each of remaining pixel units.

In another aspect of the present disclosure, there is provided an in-cell optical fingerprint display device having a substrate, a plurality of pixel units disposed on the substrate and arranged in a matrix, and a transparent cover disposed on the plurality of pixel units, wherein each of the pixel units comprises: a display pixel unit at least including a red sub-pixel unit, a green sub-pixel unit and a blue sub-pixel unit disposed on the substrate, and a fingerprint pixel unit having an optical fingerprint sensor disposed on the substrate, in which there is only one color resin of red color or green color or blue color disposed above the optical fingerprint sensor of at least one of the pixel units, while no color resin is disposed above the optical fingerprint sensor of each of remaining pixel units.

Other objects, advantages, and novel features of the disclosure will become more apparent from the following detailed description when taken in conjunction with the accompanying drawings.

DETAILED DESCRIPTION

The following embodiments describe the implementation and operation principles of the present disclosure. Those skilled in the art to which the present disclosure pertains may understand the features and effects of this disclosure through the aforementioned embodiments, and may perform combination, modification, replacement or adaption based on the spirit of the present disclosure.

Figure 1:
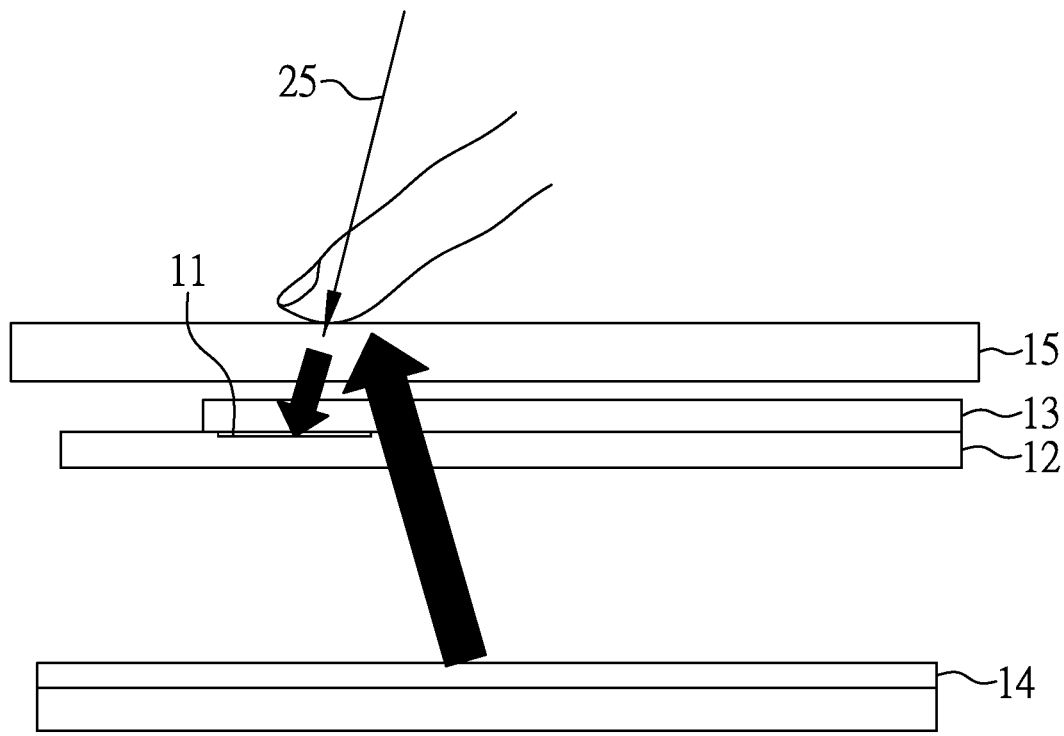
FIG. 1 is a schematic diagram illustrating the integration of optical fingerprint sensors and a liquid crystal display panel.
Figure 2:
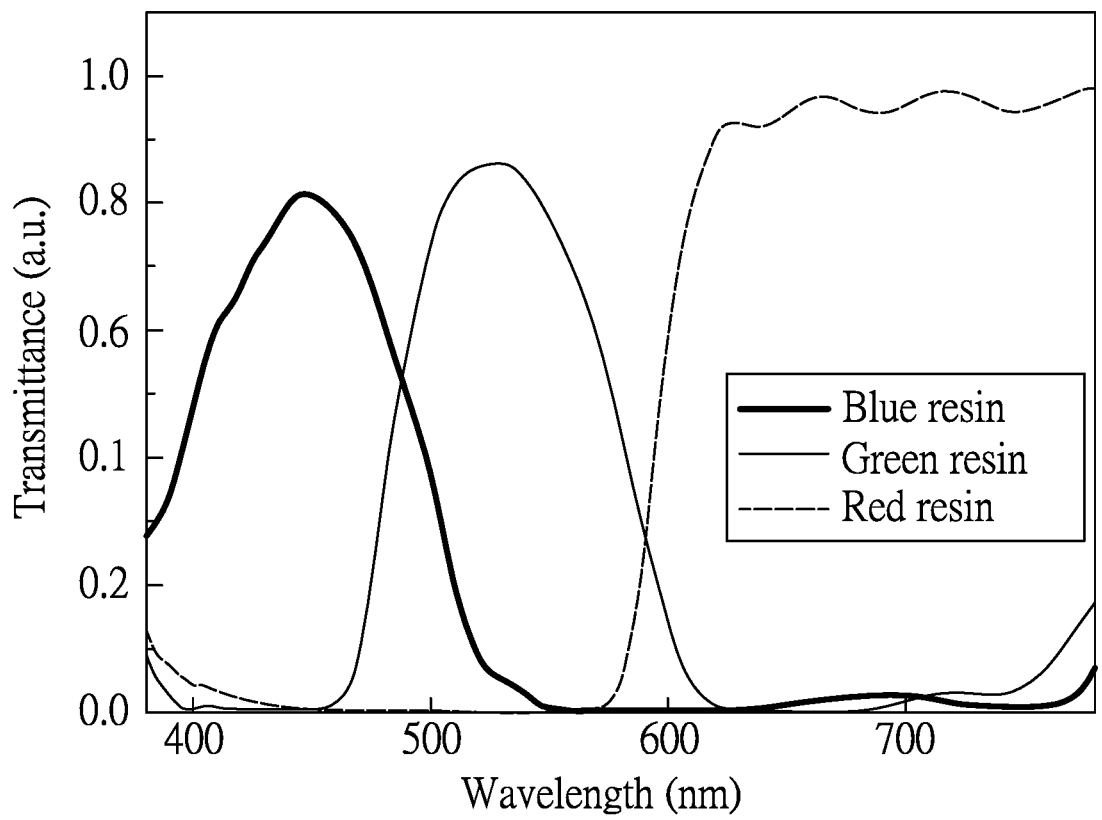
FIG. 2 shows the transmission spectrum of the red color resin, the green color resin and the blue color resin corresponding to the red sub-pixel, the green sub-pixel and the blue sub-pixel of the liquid crystal display device.

In order to reduce the false rejection rate by adding a specific-color color resin above the optical fingerprint sensor, and to achieve the anti-counterfeiting function by introducing a specific color resin arrangement, please refer to FIG. 2 which shows the transmission spectrum of the red color resin, the green color resin and the blue color resin corresponding to the red sub-pixel, the green sub-pixel and the blue sub-pixel of the liquid crystal display device (LCD). It can be seen from FIG. 2 that the green color resin and blue color resin can block red light. In general, when strong white light penetrates the finger, because the wavelengths of blue light and green light are relatively short, they are easily absorbed by the human body due to dispersion, and thus the penetrating light usually appears red color. Similar, in performing fingerprint recognition outdoors, when sunlight penetrates the finger, although the light with shorter wavelength, such as blue light and green light, will be absorbed by the human body, the light with longer wavelength, such as red light and infrared light, will still penetrate the finger, resulting in that the background signal of the optical fingerprint is too strong under strong light, and thus the accuracy of fingerprint detection is negatively affected.

Figure 3:
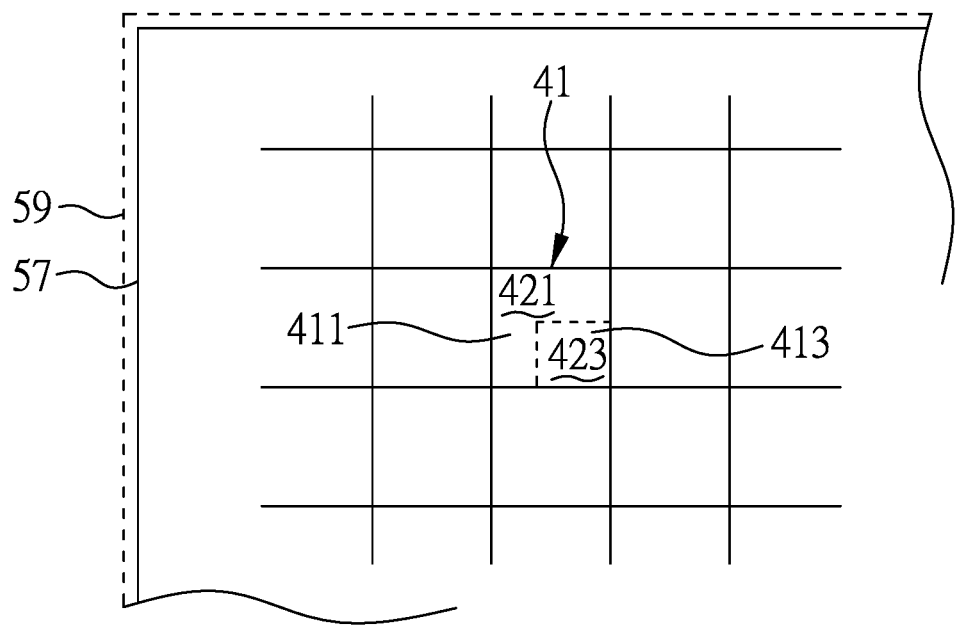
FIG. 3 is a schematic diagram illustrating the in-cell optical fingerprint display device of the present disclosure.

Therefore, with the characteristics of the green color resin and the blue color resin that can block the red light, it is able to solve the aforementioned problem that the strong sunlight may cause the background signal of the optical fingerprint to be too strong. FIG. 3 is a schematic diagram illustrating the in-cell optical fingerprint display device of the present disclosure. As shown, the in-cell optical fingerprint display device includes a substrate 57, a plurality of pixel units 41, and a transparent cover 59. The plurality of pixel units 41 are disposed on the substrate 57 and arranged in a matrix. The transparent cover 59 covers the substrate 57 and the pixel units 41 and is transparent, and thus it is represented by a dashed line in FIG. 3. Each of the pixel units 41 has a display pixel unit 411 and a fingerprint pixel unit 413. The area of the pixel unit 41 that is occupied by the display pixel unit 411 is the pixel display area 421, and the area of the pixel unit 41 that is occupied by the fingerprint pixel unit 413 is the fingerprint detection area 423. The sizes and positions of the pixel display area 421 and the fingerprint detection area 423 shown in FIG. 3 are for illustrative purpose only but not for limiting. In one embodiment, it is also applicable that part of the pixel units 41 are each provided with a display pixel unit 411 and a fingerprint pixel unit 413, while the remaining part of the pixel units 41 are each provided with a display pixel unit 411 without having a fingerprint pixel unit 413. In other words, the fingerprint pixel unit 413 and the display pixel unit 411 are not in a one-to-one configuration, and there may be more display pixel units 411 than fingerprint pixel units 413.

Figure 4:
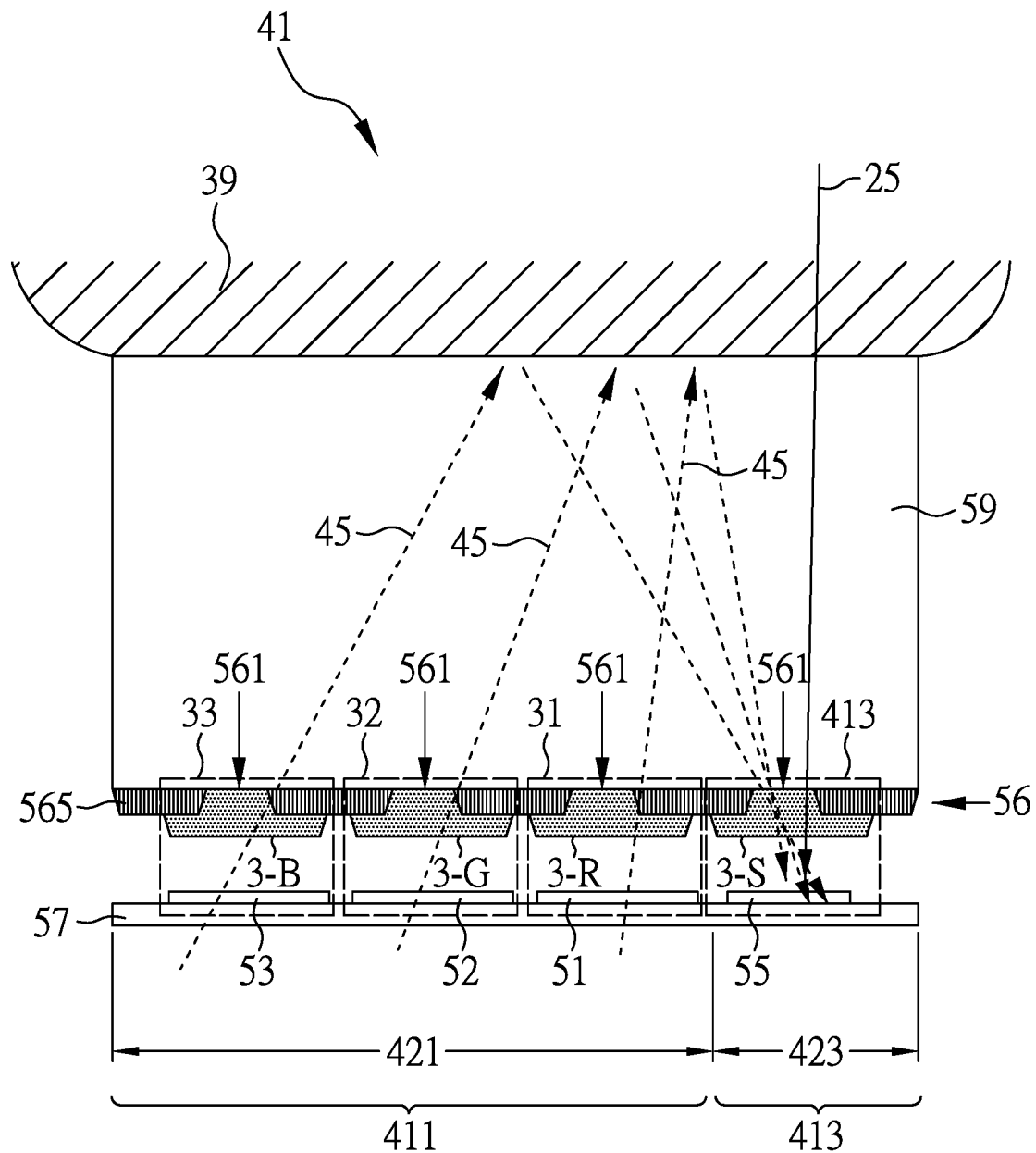
FIG. 4 shows a cross-sectional view of the pixel unit of the in-cell optical fingerprint display device according to the first embodiment of the present disclosure.

FIG. 4 shows a cross-sectional view of the pixel unit of the in-cell optical fingerprint display device according to the first embodiment of the present disclosure. In this embodiment, the display pixel unit 411 is an RGB display pixel of a liquid crystal display (LCD). As shown, one pixel unit 41 has a first display electrode 51, a second display electrode 52, a third display electrode 53, and an optical fingerprint sensor 55 disposed on the substrate 57. The pixel unit 41 includes a red color resin 3-R disposed on the first display electrode 51, a green color resin 3-G disposed on the second display electrode 52, a blue color resin 3-B disposed on the third display electrode 53, and a specific-color color resin 3-S disposed on the optical fingerprint sensor 55. The first display electrode 51 and red color resin 3-R constitute a red sub-pixel unit 31, the second display electrode 52 and the green color resin 3-G constitute a green sub-pixel unit 32, the third display electrode 53 and the blue color resin 3-B constitute a blue sub-pixel unit 33, and the optical fingerprint sensor 55 and the specific-color color resin 3-S constitute the fingerprint pixel unit 413. In this embodiment, the display pixel unit 411 is a combination of RGB sub-pixels as an example, but the present disclosure is not limited to this. The display pixel unit 411 can also be other possible combinations of sub-pixels, such as a combination of RGBW sub-pixels, a combination of RGBG sub-pixels, or a combination of RGBRGW sub-pixels, etc.

Furthermore, as shown in FIG. 4, the in-cell optical fingerprint display device is optionally provided with a black matrix 56. Since the black matrix 56 is composed of a plurality of opaque lines 565, a matrix composed of a plurality of hollow regions 561 can thus be defined, and the red sub-pixel units 31, green sub-pixel units 32, blue sub-pixel unit 33, and fingerprint pixel unit 413 are each corresponding to one hollow region 561 of the black matrix 56 in position. As a result, it is able to prevent ambient light from directly irradiating the thin film transistor circuit of the pixel unit 41, so as to maintain the display quality and fingerprint sensing of the in-cell optical fingerprint display device. In addition, the in-cell optical fingerprint display device further has a transparent cover 59 disposed on the black matrix 56 and the color resins 3-R, 3-G, 3-B, 3-S, so that the light source 45 penetrates the color resins 3-R, 3-G, and 3-B to present a color display, or the light source 45 is reflected to the optical fingerprint sensor 55 due to the user's finger 39 being pressed on the transparent cover 59 for performing fingerprint recognition.

In this embodiment, the specific-color color resin 3-S may be a blue color resin or a green color resin. Because a blue color resin or a green color resin that can filter out red light is added above the optical fingerprint sensor 55, the red light produced from the sunlight 25 penetrating the finger 39 can be filtered out by the blue color resin or the green color resin, so as to reduce the noise generated by the sunlight 25 and improve the accuracy of fingerprint judgment, thereby reducing the false rejection rate of the fingerprint recognition. Furthermore, adding blue color resin or green color resin above the optical fingerprint sensor 55 is the same in structure and manufacturing process as arranging color resins 3-R, 3-G, 3-B on the display electrodes 51, 52, 53. Therefore, the present disclosure is able to achieve fingerprint recognition with a low false rejection rate without changing the structure and manufacturing process of the display device.

Figure 5:
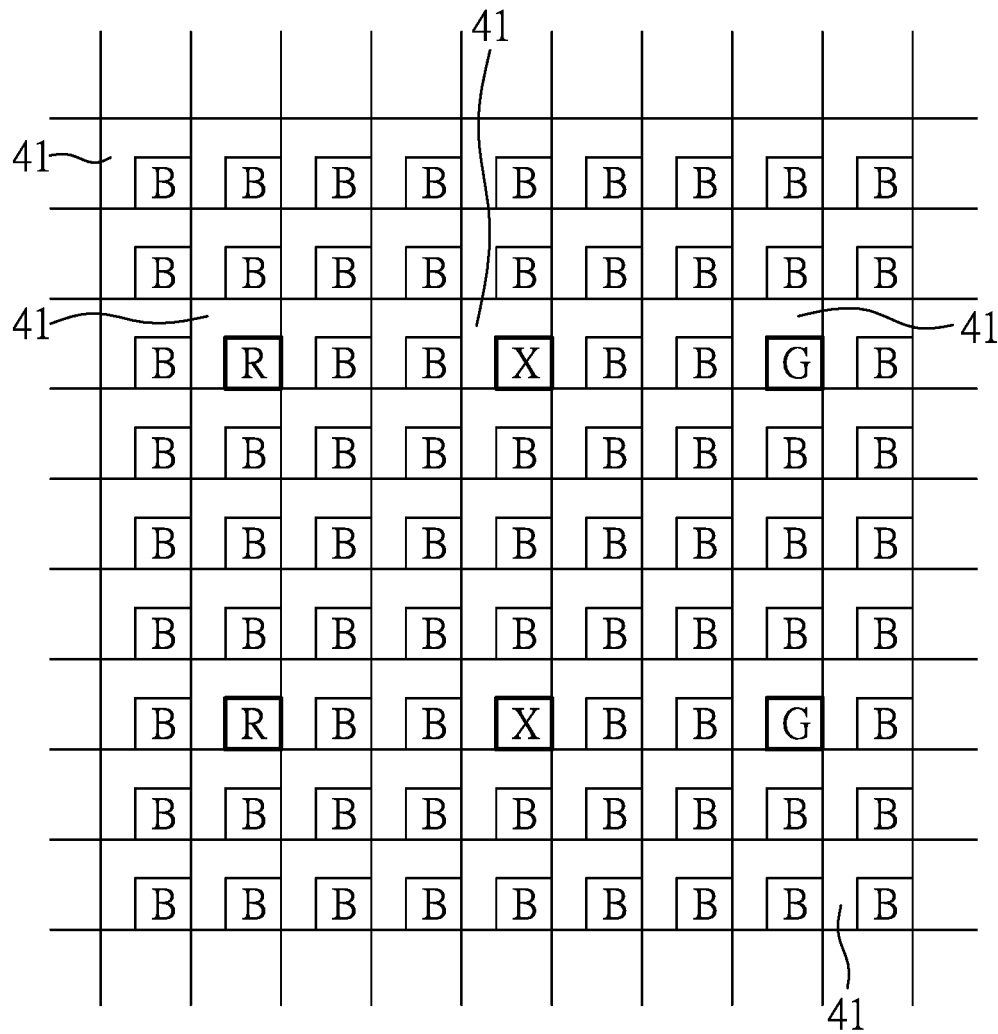
FIG. 5 shows an example of the specific color resin arrangement of the in-cell optical fingerprint display device according to the present disclosure for achieving the anti-counterfeiting function.

In addition, in order to achieve the function of anti-counterfeiting, when the specific-color color resin 3-S is a blue color resin, as shown in FIG. 5, among a plurality of pixel units 41 arranged in a matrix, there is a green color resin (denoted by G) or a red color resin (denoted by R), or there is no color resin (denoted by X) added above the optical fingerprint sensor 55 of at least one of the pixel units

41, while the optical fingerprint sensors 55 of the remaining pixel units 41 are still added with blue color resins (denoted by B) that can filter out red light so as to reduce the interference of strong sunlight. In FIG. 5, the in-cell optical fingerprint display device of the present disclosure is configured to have green color resins (denoted by G) added above the optical fingerprint sensors 55 of a plurality of pixel units 41, red color resins (denoted by R) added above the optical fingerprint sensors 55 of a plurality of pixel units 41, and no color resins (denoted by X) added above the optical fingerprint sensors 55 of a plurality of pixel units 41. However, this is only an example and not a limitation. It is conceivable that the in-cell optical fingerprint display device of the present disclosure may also be configured to have a green color resin added above the optical fingerprint sensor 55 of at least one pixel unit 41, and a red color resin added above the optical fingerprint sensor 55 of at least one pixel unit 41, or configured to have a green color resin added above the optical fingerprint sensor 55 of at least one pixel unit 41, and no color resin added above the optical fingerprint sensor 55 of at least one pixel unit 41, or configured to have a red color resin added above the optical fingerprint sensor 55 of at least one pixel unit 41, and no color resin added above the optical fingerprint sensor 55 of at least one pixel unit 41, or configured to have a green color resin added above the optical fingerprint sensor 55 of at least one pixel unit 41, or configured to have a red color resin added above the optical fingerprint sensor 55 of at least one pixel unit 41, or configured to have no color resin added above the optical fingerprint sensor 55 of at least one pixel unit 41.

Figure 6:
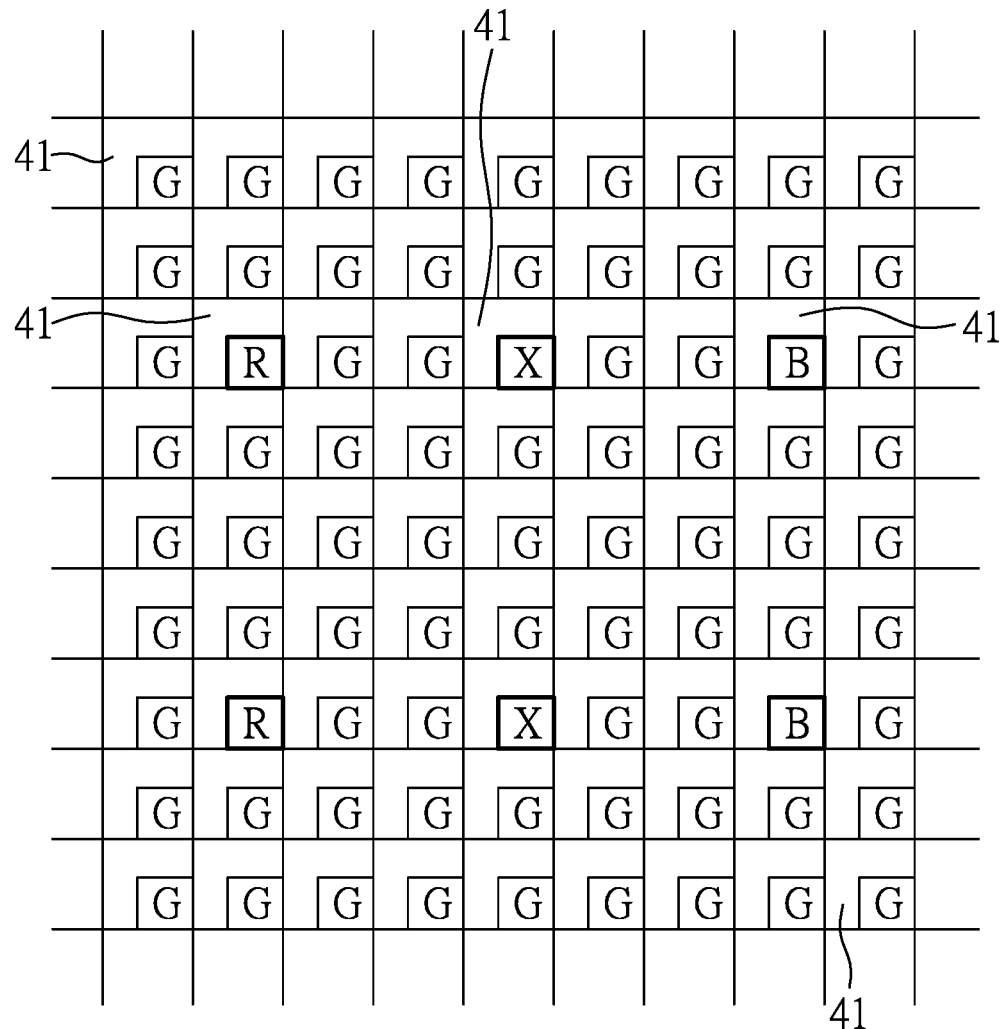
FIG. 6 shows another example of the specific color resin arrangement of the in-cell optical fingerprint display device according to the present disclosure for achieving the anti-counterfeiting function.

When the specific-color color resin 3-S is a green color resin, as shown in FIG. 6, among a plurality of pixel units 41 arranged in a matrix, there is a blue color resin (denoted by B) or a red color resin (denoted by R), or there is no color resin (denoted by X) added above the optical fingerprint sensor 55 of at least one of the pixel units 41, while the optical fingerprint sensors 55 of the remaining pixel units 41 are still added with green color resins (denoted by G) that can filter out red light so as to reduce the interference of strong sunlight. In FIG. 6, the in-cell optical fingerprint display device of the present disclosure is configured to have blue color resins (denoted by B) added above the optical fingerprint sensors 55 of a plurality of pixel units 41, red color resins (denoted by R) added above the optical fingerprint sensors 55 of a plurality of pixel units 41, and no color resins (denoted by X) added above the optical fingerprint sensors 55 of a plurality of pixel units 41. However, this is only an example and not a limitation. It is conceivable that the in-cell optical fingerprint display device of the present disclosure may also be configured to have a blue color resin added above the optical fingerprint sensor 55 of at least one pixel unit 41, and a red color resin added above the optical fingerprint sensor 55 of at least one pixel unit 41, or configured to have a blue color resin added above the optical fingerprint sensor 55 of at least one pixel unit 41, and no color resin added above the optical fingerprint sensor 55 of at least one pixel unit 41, or configured to have a red color resin added above the optical fingerprint sensor 55 of at least one pixel unit 41, and no color resin added above the optical fingerprint sensor 55 of at least one pixel unit 41, or configured to have a blue color resin added above the optical fingerprint sensor 55 of at least one pixel unit 41, or configured to have a red color resin added above the optical fingerprint sensor 55 of at least one pixel unit 41, or configured to have no color resin added above the optical fingerprint sensor 55 of at least one pixel unit 41.

Figure 7:
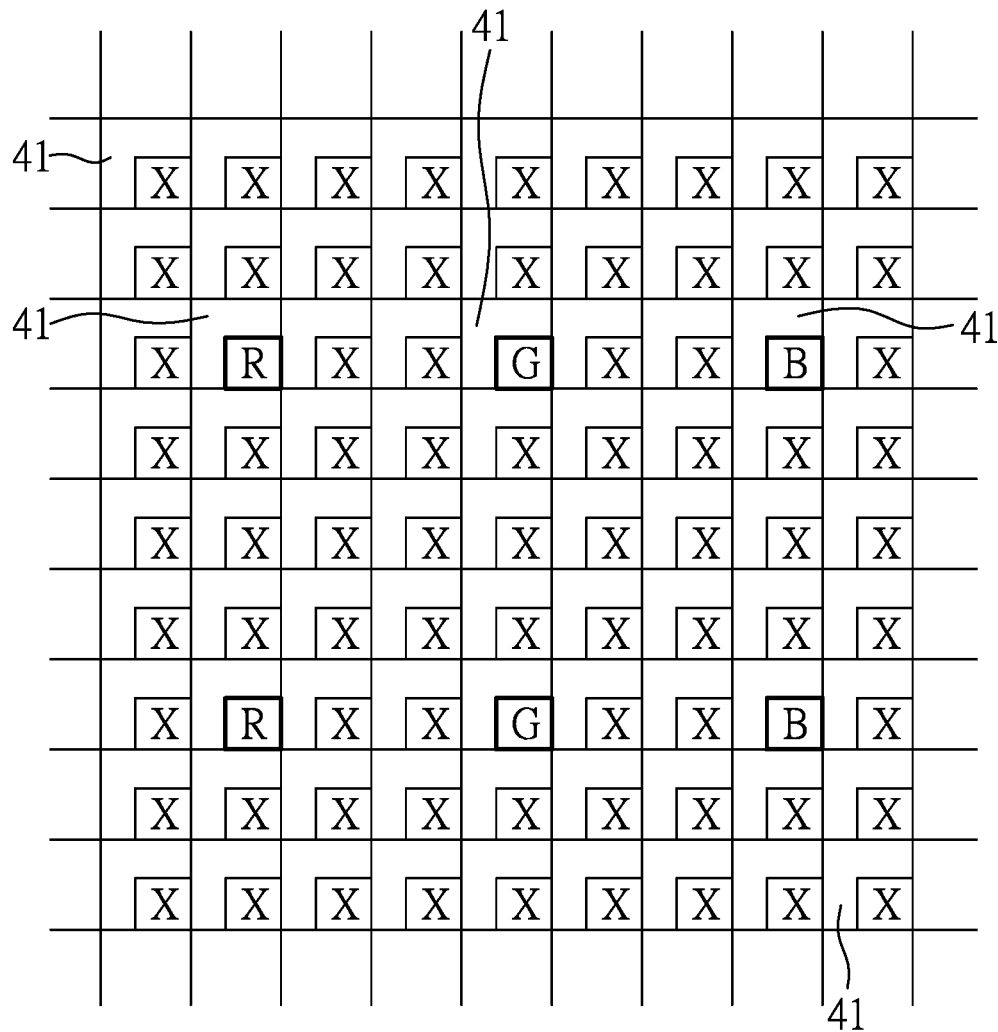
FIG. 7 shows still another example of the specific color resin arrangement of the in-cell optical fingerprint display device according to the present disclosure for achieving the anti-counterfeiting function.

Furthermore, in another embodiment of the present disclosure, the in-cell optical fingerprint display device may be designed to achieve the anti-counterfeiting function only. As shown in FIG. 7, among a plurality of pixel units 41 arranged in a matrix, there is a red color resin (denoted by R), a green color resin (denoted by G) or a blue color resin (denoted by B) added above the optical fingerprint sensor 55 of at least one of the pixel units 41, while the optical fingerprint sensors 55 of the remaining pixel units 41 are added with no color resins (denoted by X). In FIG. 7, the in-cell optical fingerprint display device of the present disclosure is configured to have red color resins (denoted by R) added above the optical fingerprint sensors 55 of a plurality of pixel units 41, green color resins (denoted by G) added above the optical fingerprint sensors 55 of a plurality of pixel units 41, and blue color resins (denoted by B) added above the optical fingerprint sensors 55 of a plurality of pixel units 41. However, this is only an example and not a limitation. It is conceivable that the in-cell optical fingerprint display device of the present disclosure may also be configured to have a blue color resin added above the optical fingerprint sensor 55 of at least one pixel unit 41, and a red color resin added above the optical fingerprint sensor 55 of at least one pixel unit 41, or configured to have a blue color resin added above the optical fingerprint sensor 55 of at least one pixel unit 41, and a green color resin added above the optical fingerprint sensor 55 of at least one pixel unit 41, or configured to have a red color resin added above the optical fingerprint sensor 55 of at least one pixel unit 41, and a green color resin added above the optical fingerprint sensor 55 of at least one pixel unit 41, or configured to have a blue color resin added above the optical fingerprint sensor 55 of at least one pixel unit 41, or configured to have a red color resin added above the optical fingerprint sensor 55 of at least one pixel unit 41, or configured to have a green color resin added above the optical fingerprint sensor 55 of at least one pixel unit 41.

With the aforementioned color resin arrangement, because fake fingerprints and real fingerprints have different colors, and real fingerprints have skin and dermis structures, the ratio of signal intensities of the fake fingerprint sensed by the optical fingerprint sensors 55 added with blue color resins, green color resins, red color resins, and no color resins will be different from the ratio of signal intensities of the real fingerprint. Therefore, based on the ratio of signal intensities sensed by the optical fingerprint sensors 55 added with blue color resins, green color resins, red color resins, and no color resins, it is able to determine whether the sensed fingerprint is a real fingerprint or a fake fingerprint. For example, when the color of the fake fingerprint is close to red, the signal intensity sensed by the optical fingerprint sensor 55 added with red color resin will be stronger, and the signal intensity sensed by the optical fingerprint sensor 55 added with color resins of other colors will be weaker, so that a fake fingerprint can be determined based on this.

Figure 8:
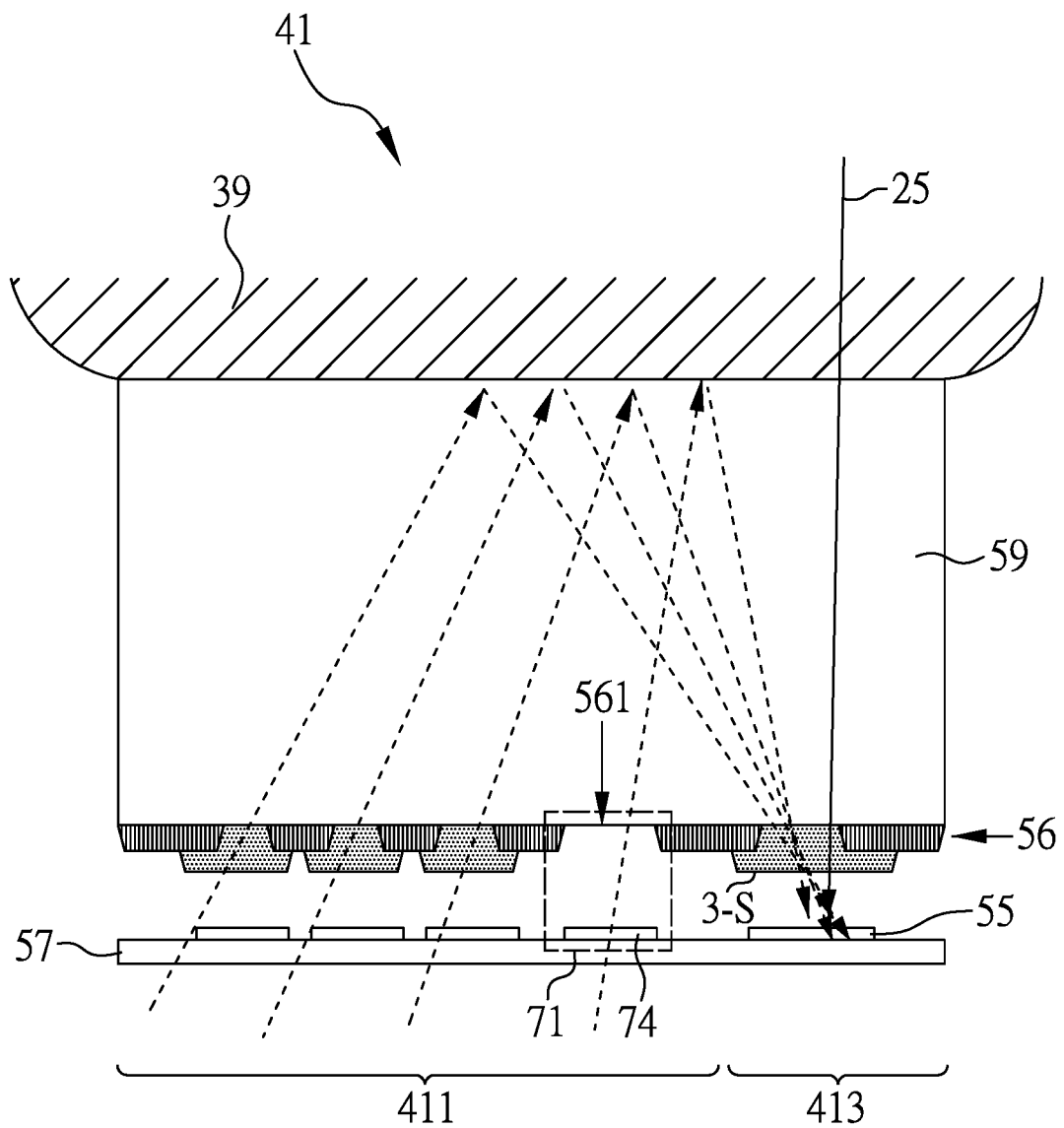
FIG. 8 shows a cross-sectional view of the pixel unit of the in-cell optical fingerprint display device according to the second embodiment of the present disclosure.

FIG. 8 shows a cross-sectional view of the pixel unit 41 of the in-cell optical fingerprint display device according to the second embodiment of the present disclosure. In this embodiment, the display pixel unit 411 is an RGBW display pixel of a liquid crystal display (LCD), which is similar in structure to the previous embodiment except that the pixel unit 41 is further provided with a fourth display electrode 74 disposed on the substrate 57, and there is no color resin disposed above the fourth display electrode 74, so that the fourth display electrode 74 is configured as a white sub-pixel unit 71, and this white sub-pixel unit 71 also corresponds in position to a hollow region 561 of the black matrix 56. In this embodiment, the specific-color color resin 3-S is still to be a blue or green color resin, so as to filter out the red light presented when the sunlight 25 penetrates the finger 39, thereby reducing the noise generated by the sunlight and improving the accuracy of fingerprint judgment, and reducing the false rejection rate of fingerprint recognition. In addition, the corresponding anti-counterfeiting design of this embodiment is the same as that of the previous embodiment, and thus the detailed description is deemed unnecessary.

Figure 9:
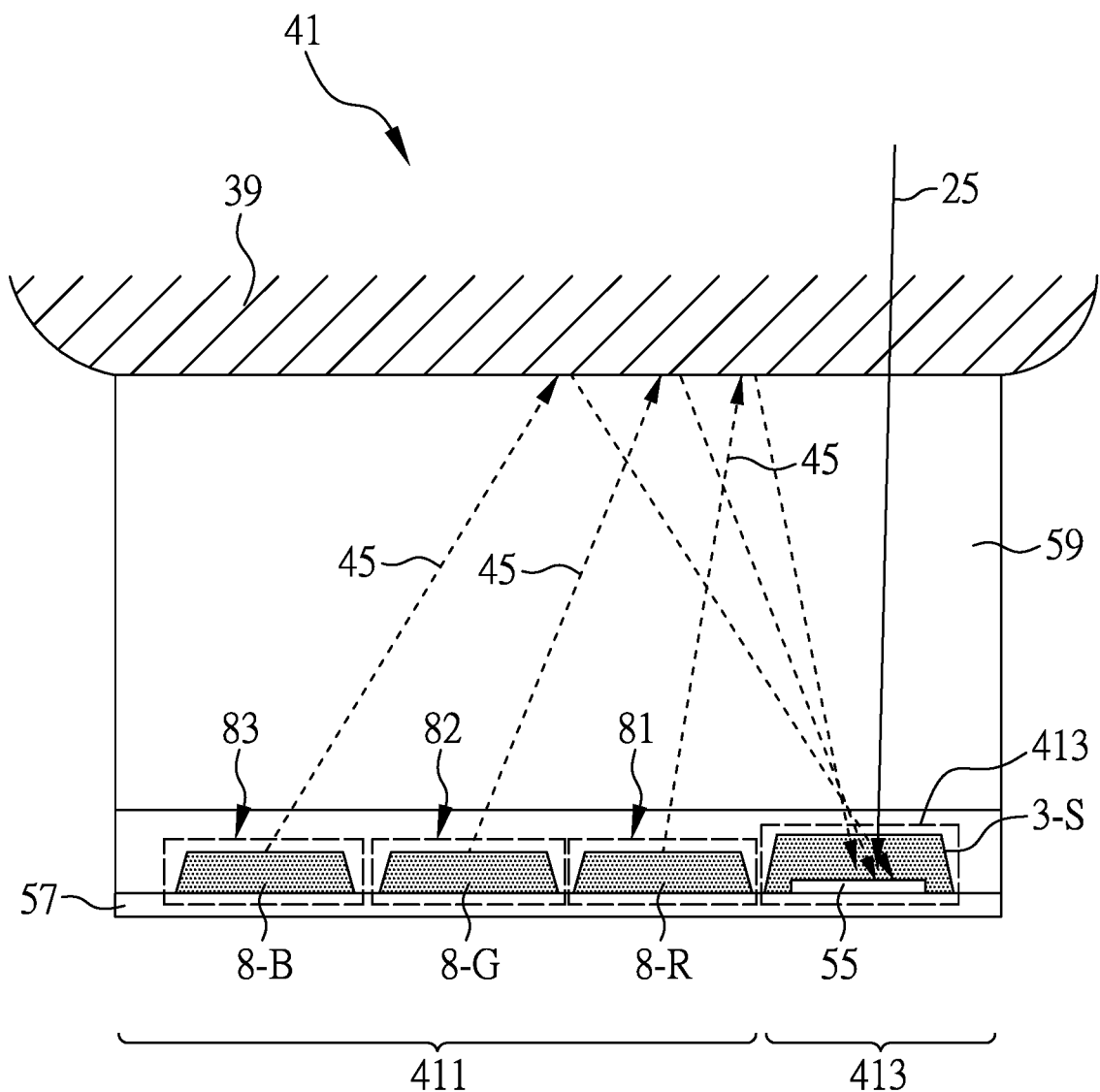
FIG. 9 shows a cross-sectional view of the pixel unit of the in-cell optical fingerprint display device according to the third embodiment of the present disclosure.

FIG. 9 shows a cross-sectional view of the pixel unit 41 of the in-cell optical fingerprint display device according to the third embodiment of the present disclosure. In this embodiment, the display pixel unit 411 is an RGB display pixel of an organic light emitting diode (OLED), wherein a pixel unit 41 has a red organic light emitting diode 8-R, a green organic light emitting diode 8-G, a blue organic light emitting diode 8-B and an optical fingerprint sensor 55 disposed on a substrate 57, and there is a specific-color color resin 3-S arranged above the optical fingerprint sensor 55. The red organic light emitting diode 8-R constitutes a red sub-pixel unit 81, the green organic light emitting diode 8-G constitutes a green sub-pixel unit 82, the blue organic light emitting diode 8-B constitutes a blue sub-pixel unit 83, and the optical fingerprint sensor 55 and the specific-color color resin 3-S constitute the fingerprint pixel unit 413. In addition, the in-cell optical fingerprint display device is further provided with a transparent cover 59 disposed on the red sub-pixel unit 81, the green sub-pixel unit 82, the blue sub-pixel unit 83, and the fingerprint pixel unit 413, so that the light source 45 emitted from the red organic light emitting diode 8-R, the green organic light emitting diode 8-G, and the blue organic light emitting diode 8-B presents a color display, or the light source 45 is reflected to the optical fingerprint sensor 55 due to the user's finger 39 being pressed on the transparent cover 59 for performing fingerprint recognition.

In this embodiment, the specific-color color resin 3-S is a blue color resin or a green color resin. Because a blue color resin or a green color resin that can filter out red light is added above the optical fingerprint sensor 55, the red light presented when the sunlight 25 penetrates the finger 39 can be filtered out by the blue color resin or the green color resin, so as to reduce the noise generated by the sunlight 25 and improve the accuracy of fingerprint judgment, thereby reducing the false rejection rate of the fingerprint recognition. In addition, the corresponding anti-counterfeiting design of this embodiment is the same as that of the first embodiment, and thus a detailed description is deemed unnecessary.

Besides, in addition to the visible light, due to the strong energy of sunlight in the infrared band (700~900 nm), the specific-color color resin 3-S (green color resin or blue color resin) of the in-cell optical fingerprint display device of the present disclosure can be further added with organic color materials with an absorption band in the near infrared region of about 700-900 nm so as to improve the filtering effect of the green color resin and blue color resin in the infrared band.

It can be seen from the above description that, based on the green color resin and the blue color resin being capable of blocking red light, the present disclosure is provided to arrange green color resins and blue color resins on the optical fingerprint sensors, which can effectively filter out red light presented when the sunlight penetrates the finger so as to reduce the noise caused by sunlight and improve the accuracy of fingerprint judgment, thereby reducing the false rejection rate of fingerprint recognition. In addition, by introducing a specific color resin arrangement, it is able to determine whether the sensed fingerprint is a real fingerprint or a fake fingerprint according to the ratio of signal intensities sensed by the optical fingerprint sensor, so as to achieve the anti-counterfeiting function.

The aforementioned embodiments are examples only for convenience of description. The scope of the present disclosure is claimed hereinafter in the claims and is not limited to the embodiments.

What is claimed is:

1. An in-cell optical fingerprint display device having a substrate, a plurality of pixel units disposed on the substrate and arranged in a matrix, and a transparent cover disposed on the plurality of pixel units, wherein each of the pixel units comprises: a display pixel unit at least including a red sub-pixel unit, a green sub-pixel unit and a blue sub-pixel unit disposed on the substrate, and a fingerprint pixel unit having an optical fingerprint sensor disposed on the substrate, in which there is only one color resin of blue color or red color or no color resin disposed above the optical fingerprint sensor of at least one of the pixel units and there is no green color resin disposed above the optical fingerprint sensor of the at least one of the pixel units, while only one color resin of green color is disposed above the optical fingerprint sensor of each of remaining pixel units and there is no red color resin or blue color resin disposed above the optical fingerprint sensor of each of remaining pixel units.

2. The in-cell optical fingerprint display device of claim 1, wherein a blue color resin, a red color resin or no color resin being disposed above the optical fingerprint sensor of at least one pixel unit is configured as: a blue color resin is disposed above the optical fingerprint sensor of at least one pixel unit, a red color resin is disposed above the optical fingerprint sensor of at least one pixel unit, and no color resin is disposed above the optical fingerprint sensor of at least one pixel unit; a blue color resin is disposed above the optical fingerprint sensor of at least one pixel unit, and a red color resin is disposed above the optical fingerprint sensor of at least one pixel unit; a blue color resin is disposed above the optical fingerprint sensor of at least one pixel unit, and no color resin is disposed above the optical fingerprint sensor of at least one pixel unit; a red color resin is disposed above the optical fingerprint sensor of at least one pixel unit, and no color resin is disposed above the optical fingerprint sensor of at least one pixel unit; a blue color resin is disposed above the optical fingerprint sensor of at least one pixel unit; a red color resin is disposed above the optical fingerprint sensor of at least one pixel unit; or no color resin is disposed above the optical fingerprint sensor of at least one pixel unit.

3. The in-cell optical fingerprint display device of claim 1, wherein the red sub-pixel unit includes a first display electrode disposed on the substrate and a red color resin disposed above the first display electrode, the green sub-pixel unit includes a second display electrode disposed on the substrate and a green color resin disposed above the second display electrode, and the blue sub-pixel unit includes a third display electrode disposed on the substrate and a blue color resin disposed above the third display electrode.

4. The in-cell optical fingerprint display device of claim 3, further comprising a black matrix composed of a plurality of opaque lines so as to define a plurality of hollow regions arranged in a matrix, wherein the red sub-pixel unit, the green sub-pixel unit, the blue sub-pixel unit and the fingerprint pixel unit of each pixel unit are each corresponding to a hollow region of the black matrix in position.

5. The in-cell optical fingerprint display device of claim 3, wherein the display pixel unit is further provided with a white sub-pixel unit having a fourth display electrode disposed on the substrate, and no color resin is disposed above the fourth display electrode.

6. The in-cell optical fingerprint display device of claim 5, further comprising a black matrix composed of a plurality of opaque lines so as to define a plurality of hollow regions arranged in a matrix, wherein the red sub-pixel unit, the green sub-pixel unit, the blue sub-pixel unit, the white sub-pixel unit and the fingerprint pixel unit of each pixel unit are each corresponding to a hollow region of the black matrix in position.

7. The in-cell optical fingerprint display device of claim 1, wherein the red sub-pixel unit has a red organic light emitting diode disposed on the substrate, the green sub-pixel unit has a green organic light emitting diode disposed on the substrate, and the blue sub-pixel unit has a blue organic light emitting diode disposed on the substrate.

8. An in-cell optical fingerprint display device having a substrate, a plurality of pixel units disposed on the substrate and arranged in a matrix, and a transparent cover disposed on the plurality of pixel units, wherein each of the pixel units comprises: a display pixel unit at least including a red sub-pixel unit, a green sub-pixel unit and a blue sub-pixel unit disposed on the substrate, and a fingerprint pixel unit having an optical fingerprint sensor disposed on the substrate, in which there is only one color resin of red color or green color or blue color disposed above the optical fingerprint sensor of at least one of the pixel units, while no color resin is disposed above the optical fingerprint sensor of each of remaining pixel units.

9. The in-cell optical fingerprint display device of claim 8, wherein a red color resin, a green color resin or a blue color resin being disposed above the optical fingerprint sensor of at least one pixel unit is configured as: a red color resin is disposed above the optical fingerprint sensor of at least one pixel unit, a green color resin is disposed above the optical fingerprint sensor of at least one pixel unit, and a blue color resin is disposed above the optical fingerprint sensor of at least one pixel unit; a blue color resin is disposed above the optical fingerprint sensor of at least one pixel unit, and a red color resin is disposed above the optical fingerprint sensor of at least one pixel unit; a blue color resin is disposed above the optical fingerprint sensor of at least one pixel unit, and a green color resin is disposed above the optical fingerprint sensor of at least one pixel unit; a red color resin is disposed above the optical fingerprint sensor of at least one pixel unit, and a green color resin is disposed above the optical fingerprint sensor of at least one pixel unit; a blue color resin is disposed above the optical fingerprint sensor of at least one pixel unit; a red color resin is disposed above the optical fingerprint sensor of at least one pixel unit; or a green color resin is disposed above the optical fingerprint sensor of at least one pixel unit.

10. The in-cell optical fingerprint display device of claim 8, wherein the red sub-pixel unit includes a first display electrode disposed on the substrate and a red color resin disposed above the first display electrode, the green sub-pixel unit includes a second display electrode disposed on the substrate and a green color resin disposed above the second display electrode, and the blue sub-pixel unit includes a third display electrode disposed on the substrate and a blue color resin disposed above the third display electrode.

11. The in-cell optical fingerprint display device of claim 10, further comprising a black matrix composed of a plurality of opaque lines so as to define a plurality of hollow regions arranged in a matrix, wherein the red sub-pixel unit, the green sub-pixel unit, the blue sub-pixel unit and the fingerprint pixel unit of each pixel unit are each corresponding to a hollow region of the black matrix in position.

12. The in-cell optical fingerprint display device of claim 10, wherein the display pixel unit is further provided with a white sub-pixel unit having a fourth display electrode disposed on the substrate, and no color resin is disposed above the fourth display electrode.

13. The in-cell optical fingerprint display device of claim 12, further comprising a black matrix composed of a plurality of opaque lines so as to define a plurality of hollow regions arranged in a matrix, wherein the red sub-pixel unit, the green sub-pixel unit, the blue sub-pixel unit, the white sub-pixel unit, and the fingerprint pixel unit of each pixel unit are each corresponding to a hollow region of the black matrix in position.

14. The in-cell optical fingerprint display device of claim 8, wherein the red sub-pixel unit has a red organic light emitting diode disposed on the substrate, the green sub-pixel unit has a green organic light emitting diode disposed on the substrate, and the blue sub-pixel unit has a blue organic light emitting diode disposed on the substrate.

* * * * *